United States Patent
Maszara et al.

(10) Patent No.: US 8,673,718 B2
(45) Date of Patent: Mar. 18, 2014

(54) METHODS OF FORMING FINFET DEVICES WITH ALTERNATIVE CHANNEL MATERIALS

(75) Inventors: Witold P. Maszara, Morgan Hill, CA (US); Ajey P. Jacob, Albany, NY (US); Nicholas V. LiCausi, Watervliet, NY (US); Jody A. Fronheiser, Delmar, NY (US); Kerem Akarvardar, Saratoga Springs, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 44 days.

(21) Appl. No.: 13/544,259

(22) Filed: Jul. 9, 2012

(65) Prior Publication Data

US 2014/0011341 A1 Jan. 9, 2014

(51) Int. Cl.
*H01L 21/335* (2006.01)

(52) U.S. Cl.
USPC ........................................ 438/268; 438/269

(58) Field of Classification Search
USPC ........... 438/268, 269; 257/E21.001, E21.409, 257/E21.442
See application file for complete search history.

(56) References Cited

U.S. PATENT DOCUMENTS

| | | | |
|---|---|---|---|
| 6,835,618 B1 * | 12/2004 | Dakshina-Murthy et al. | 438/256 |
| 7,655,534 B2 | 2/2010 | Sheen et al. | |
| 7,687,351 B2 * | 3/2010 | Oyu | 438/268 |
| 7,842,559 B2 * | 11/2010 | Jakschik et al. | 438/150 |
| 8,183,627 B2 * | 5/2012 | Currie | 257/329 |
| 8,497,171 B1 * | 7/2013 | Wu et al. | 438/218 |
| 2008/0224258 A1 * | 9/2008 | Schepis et al. | 257/522 |
| 2009/0057846 A1 * | 3/2009 | Doyle et al. | 257/623 |
| 2011/0101421 A1 | 5/2011 | Xu | |
| 2011/0147811 A1 * | 6/2011 | Kavalieros et al. | 257/288 |
| 2011/0210404 A1 | 9/2011 | Su et al. | |
| 2013/0105914 A1 * | 5/2013 | Lin | 257/402 |

* cited by examiner

*Primary Examiner* — Michele Fan
(74) *Attorney, Agent, or Firm* — Amerson Law Firm, PLLC (57) ABSTRACT

One method involves providing a substrate comprised of first and second semiconductor materials, performing an etching process through a hard mask layer to define a plurality of trenches that define first and second portions of a fin for a FinFET device, wherein the first portion is the first material and the second portion is the second material, forming a layer of insulating material in the trenches, performing a planarization process on the insulating material, performing etching processes to remove the hard mask layer and reduce a thickness of the second portion, thereby defining a cavity, performing a deposition process to form a third portion of the fin on the second portion, wherein the third portion is a third semiconducting material that is different from the second material, and performing a process such that a post-etch upper surface of the insulating material is below an upper surface of the third portion.

16 Claims, 5 Drawing Sheets

METHODS OF FORMING FINFET DEVICES WITH ALTERNATIVE CHANNEL MATERIALS

BACKGROUND OF THE INVENTION

1. Field of the Invention

Generally, the present disclosure relates to the manufacture of sophisticated semiconductor devices, and, more specifically, to various methods of forming FinFET devices with alternative channel materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

As device dimensions decrease and customers demand higher performance devices, device designers are driven to develop new product designs to address these and other issues. One technique that has been employed in the prior art has been to attempt to use alternative materials, such as III-V materials, for all or part of the fin structure. For example, one prior art technique involved performing an epitaxial deposition process to blanket-deposit a III-V material on a silicon semiconducting substrate and thereafter performing an etching process to define the fins. Other prior art techniques involved utilization of selective epitaxial growth in trench/line structures formed on an otherwise planar surface. However, these methods have not achieved widespread adoption due to a variety of reasons. What is desired is a reliable and repeatable methodology for forming fins for FinFET devices that are comprised of an alternative material to that of the substrate.

The present disclosure is directed to various methods of forming FinFET devices with alternative channel materials.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET devices with alternative channel materials. One illustrative method disclosed herein involves providing a substrate comprised of a first semiconducting material, performing a first epitaxial deposition process to form a layer of a second semiconductor material above the substrate and performing a first etching process through a patterned hard mask layer to define a plurality of trenches that define first and second portions of a fin for a FinFET device, wherein the first portion is comprised of the first semiconductor material and the second portion is comprised of the second semiconductor material. The method also includes forming a layer of insulating material in the trenches, performing a planarization process on the layer of insulating material, performing at least one etching process to remove the patterned hard mask layer, performing at least one third etching process to reduce a thickness of the second portion of the fin and thereby define a cavity within the layer of insulating material above the second portion of the fin, performing a second epitaxial deposition process to form a third portion of the fin on the second portion of the fin within the cavity, wherein the third portion of the fin is comprised of a third semiconducting material that is different than the second semiconducting material, and performing a fourth etching process on the layer of insulating material such that a post-etch upper surface of the insulating material after the fourth etching process is performed is below an upper surface of the third portion of the fin.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming FinFET devices with alternative channel materials. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 1A:
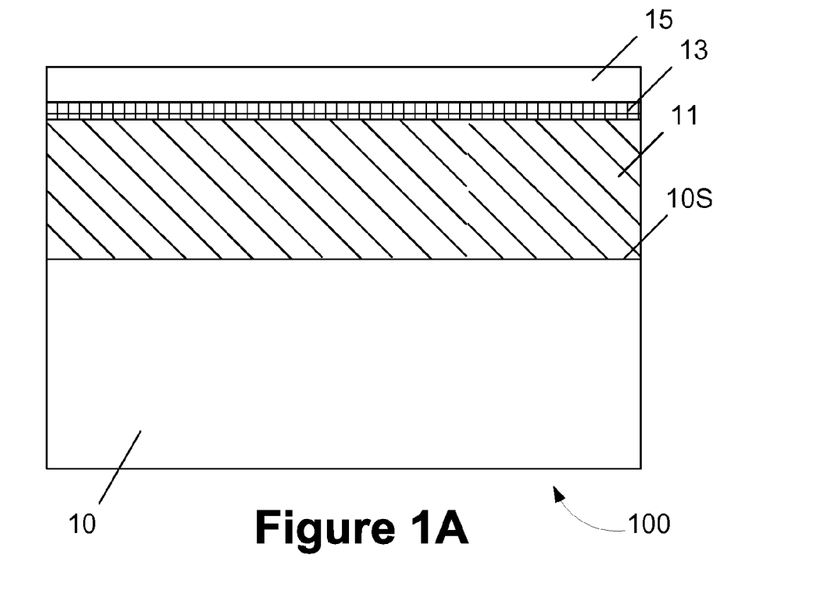
FIGS. 1A-1I depict various methods disclosed herein for of forming FinFET devices with alternative channel materials.

FIG. 1A is a simplified view of an illustrative semiconductor device 100 at an early stage of manufacturing. The semiconductor device 100 is formed above an illustrative bulk semiconducting substrate 10 having an upper surface 10S. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor structures. The substrate 10 may also be made of materials other than silicon.

With continuing reference to FIG. 1A, a layer of semiconductor material 11, a protective layer 13 and a polish stop layer 15 have been formed above the substrate 10. The layer of semiconductor material 11 may be formed by performing an epitaxial deposition process. The layer of semiconductor material 11 may be comprised of a variety of different materials, e.g., silicon/germanium, silicon/carbon, III-V materials, II-VI materials, etc., or combinations thereof, and it may be either doped (in situ) or undoped. The thickness of the layer of semiconductor material 11 may also vary depending upon the particular application, e.g., 30-60 nm. In one illustrative embodiment, the layer of semiconductor material 11 may be a fully strained layer of silicon/germanium ($Si_{1-x}Ge_x$, where x=0.01-0.99) or germanium with a thickness of about 25-100 nm. In one particular example, the layer of semiconductor material may have a germanium concentration of about 25-75%, which will depend upon the active channel material requirements. In general, in one illustrative embodiment, the layer of semiconductor material 11 may be made of a material that has a lattice constant that is intermediate the lattice constant of the substrate 10 and another semiconductor material (not shown in FIG. 1A) that will be formed on the layer of semiconductor material 11, as will be described more fully below. In some cases, the layer of semiconductor material 11 may be made of a material that has a band gap structure that is useful in controlling carrier flow, e.g., the flow of electrons or holes during device operation. In one illustrative example, the protection layer 13 may be a pad oxide layer having a thickness on the order of about 10 nm, and it may be formed by performing a thermal growth process or a chemical vapor deposition (CVD) process. In one illustrative example, the polish stop layer 15 may be a pad nitride layer having a thickness on the order of about 80 nm, and it may be formed by performing a CVD process.

Figure 1B:
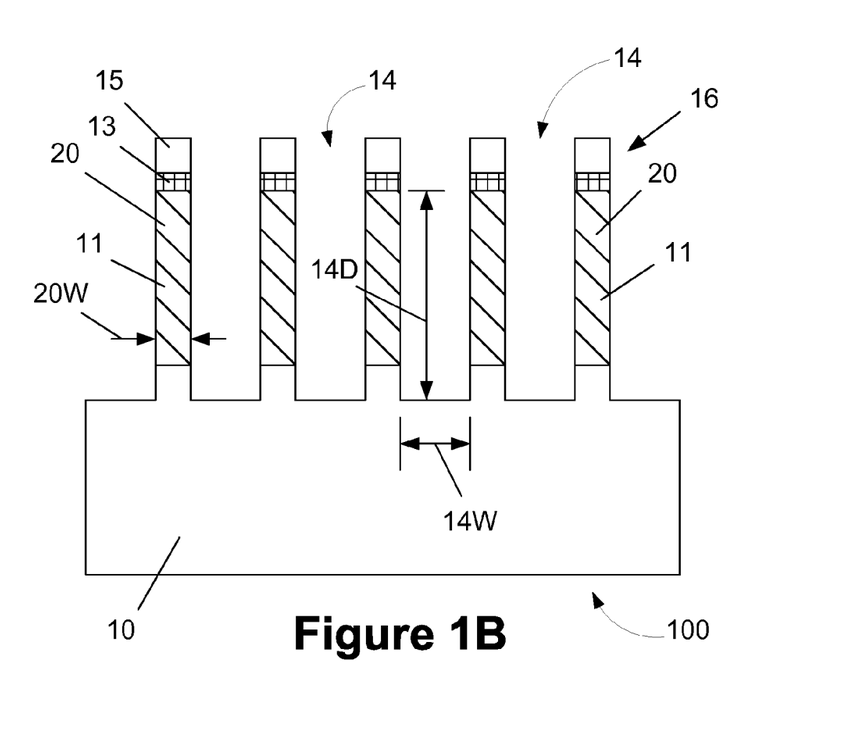

FIG. 1B depicts the device 100 after several process operations have been performed. Initially, the protective layer 13 and the polish stop layer 15 were patterned to define, collectively, a patterned hard mask layer 16. In one illustrative embodiment, the patterned hard mask layer 16 may be patterned using known sidewall image transfer techniques and/or photolithographic techniques combined with performing known etching techniques.

With continuing reference to FIG. 1B, an etching process, such as a dry or wet etching process, is then performed on the substrate 10 through the patterned hard mask layer 16 to form a plurality of trenches 14. This etching process results in the definition of a plurality of fins 20. In the depicted example, the trenches 14 extend into the substrate 10 for a distance of about 10-20 nm, although that may not be the case in all applications. As discussed more fully below, the substrate 10 and the layer of semiconductor material 11 depicted in FIG. 1B are actually portions of the final fin structure for the device 100, as other material will be added to define the final fin structure, as described below. In some applications, a further etching process may be performed to reduce the width or to "thin" the fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

With continuing reference to FIG. 1B, the overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-150 nm and the width 14W of the trenches 14 may range from about 20-50 nm. In some embodiments, the fins 20 may have a final width 20W within the range of about 5-30 nm. In the illustrative example depicted in FIGS. 1A-1I, the trenches 14 and fins 20 are all of a uniform size and shape. However, as discussed more fully below, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1C:
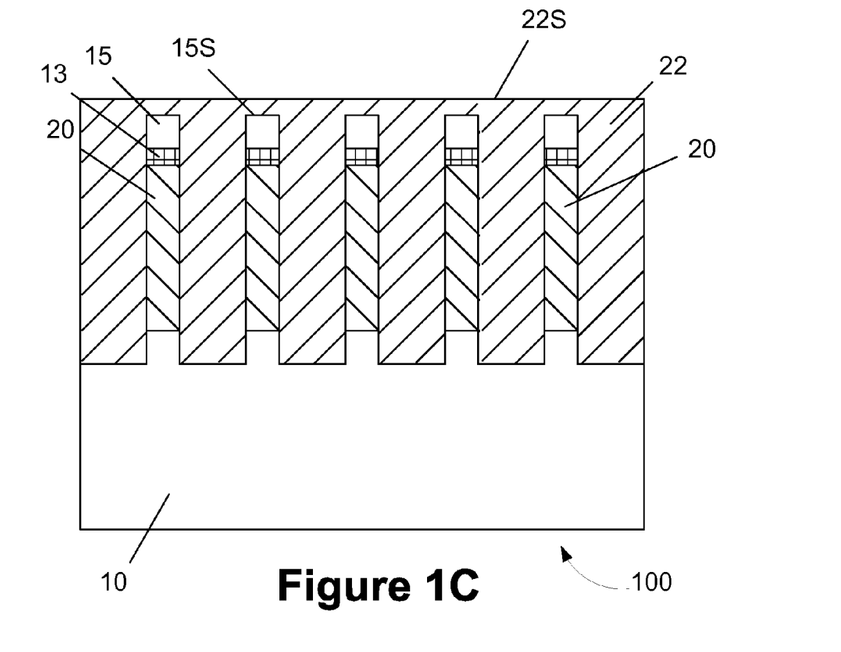

Then, as shown in FIG. 1C, a layer of insulating material 22 is formed in the trenches 14 of the device such that it overfills the trenches 14. The layer of insulating material 22 may be comprised of a variety of different materials, such as silicon dioxide, etc., and it may be formed by performing a variety of techniques, e.g., CVD, spin-coating, etc. In one illustrative embodiment, the layer of insulating material 22 may be a flowable oxide material that is formed by performing a CVD process. Such a flowable oxide material is adapted for use with fins 20 of different configurations, even fins 20 with a reentrant profile. In the example depicted in FIG. 1C, the surface 22S of the layer of insulating material 22 is the "as-deposited" surface of the layer 22. In this example, the surface 22S of the layer of insulating material 22 may be positioned slightly above the upper surface 15S of the polish stop layer 15, e.g., about 4-10 nm.

Figure 1D:
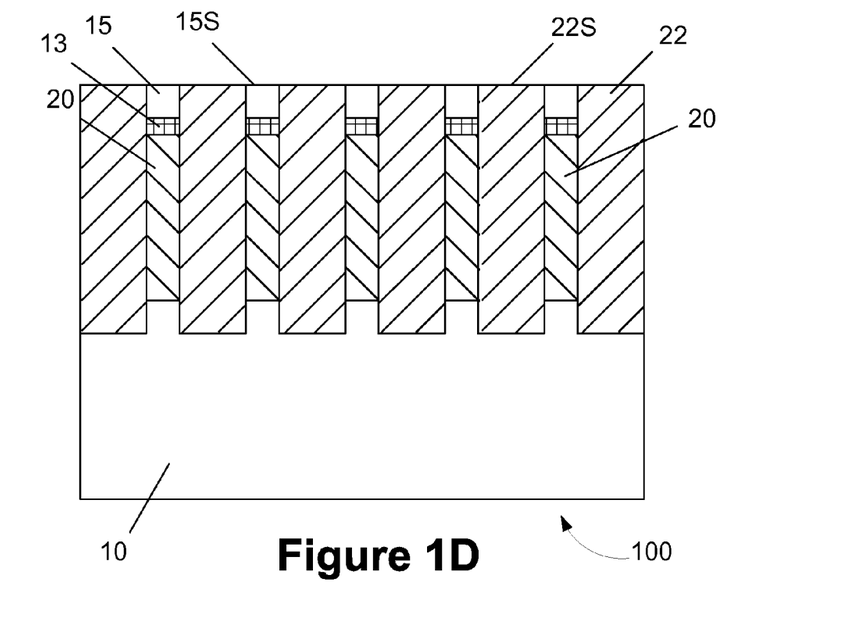

Next, as shown in FIG. 1D, one or more chemical mechanical polishing (CMP) processes may be performed to planarize the surface 22S using the polish stop layer 15 to stop the CMP process. After such a CMP process, the surface 22S of the layer of insulating material 22 is substantially level with the surface 15S of the polish stop layer 15.

Figure 1E:
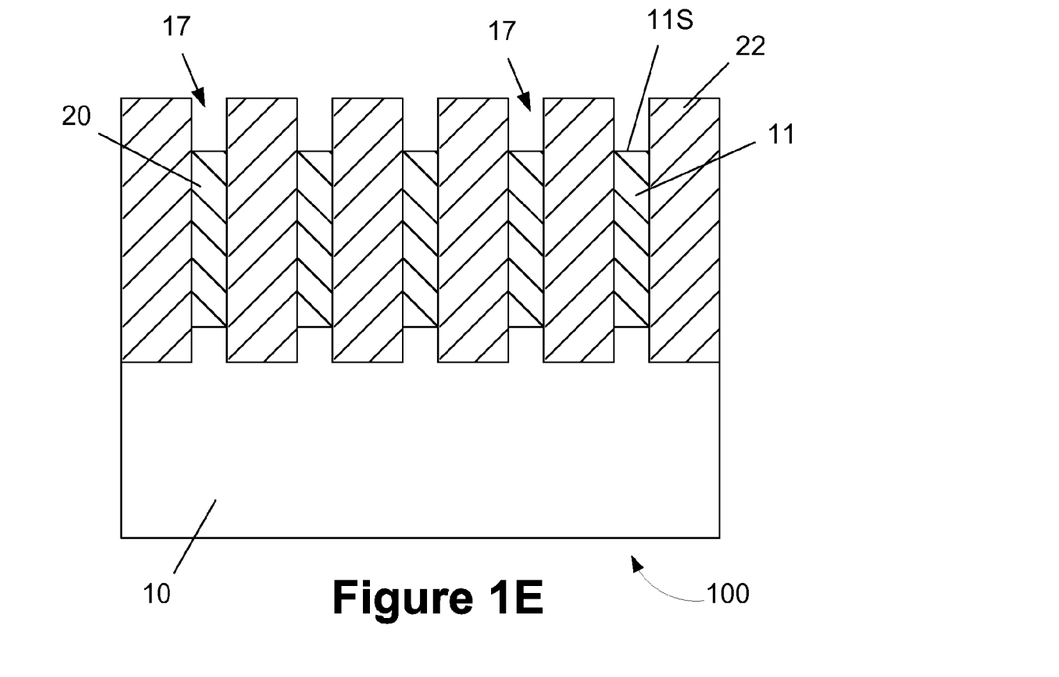

Next, as shown in FIG. 1E, one or more etching processes, wet or dry, are performed to remove the polish stop layer 15 and the protective layer 13 from above the layer of semiconductor material 11 and thereby define a cavity 17 that exposes the upper surface 11S of the layer of semiconductor material 11 for further processing. In one illustrative embodiment, where the polish stop layer 15 is comprised of silicon nitride and the protective layer 13 is comprised of silicon dioxide, an initial wet etching process is performed using hot phosphorous acid to remove the polish stop layer 15 relative to the protective layer 13. Thereafter, another wet etching process is performed using, for example, a dilute HF acid to remove the protective layer 13 relative to the layer of semiconductor material 11.

Figure 1F:
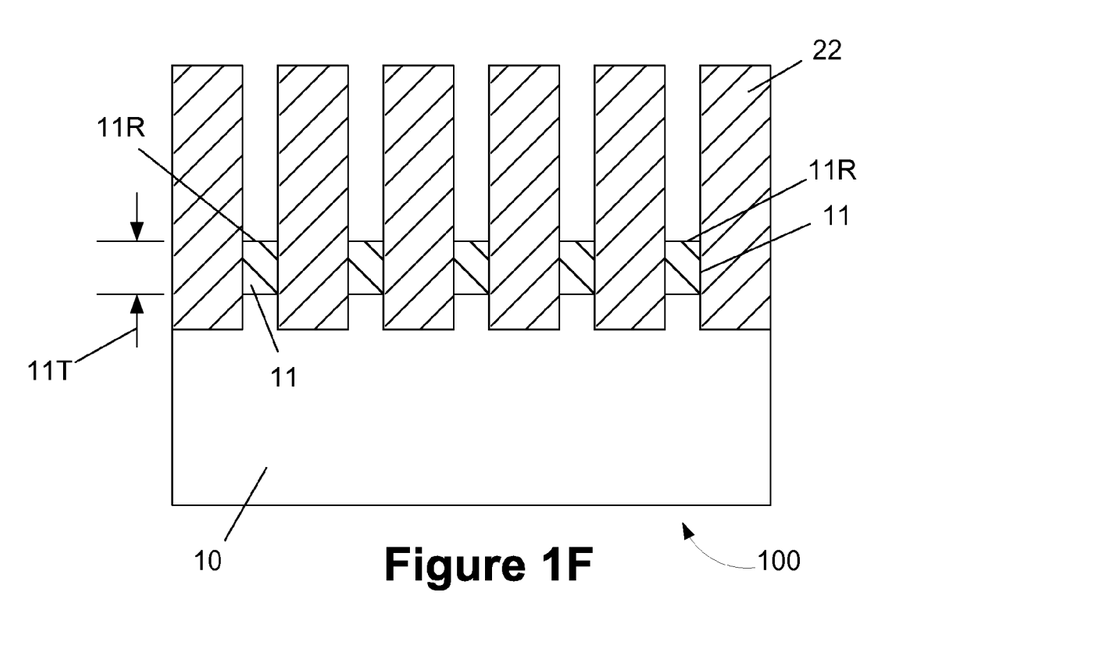

Then, as shown in FIG. 1F, an etching process, such as a dry, wet or vapor phase etching process, is performed to reduce the thickness of the layer of semiconductor material 11 with a recessed surface 11R. The thickness 11T of the layer of semiconductor material 11 after the etching process is performed may vary depending upon the particular application, e.g., the thickness 11T may be about 10-20 nm. The etching process results in a layer of insulating material 11 having a recessed surface 11R. The etching process should be a process that is highly selective to the material of the layer of insulating material 22. In the case where the layer of insulating material 22 is comprised of silicon dioxide and the layer of semiconductor material 11 is comprised of silicon/germanium, the etching process to reduce the thickness of the layer of semiconductor material 11 may be a vapor etching process that is performed using HCl vapors.

Figure 1G:
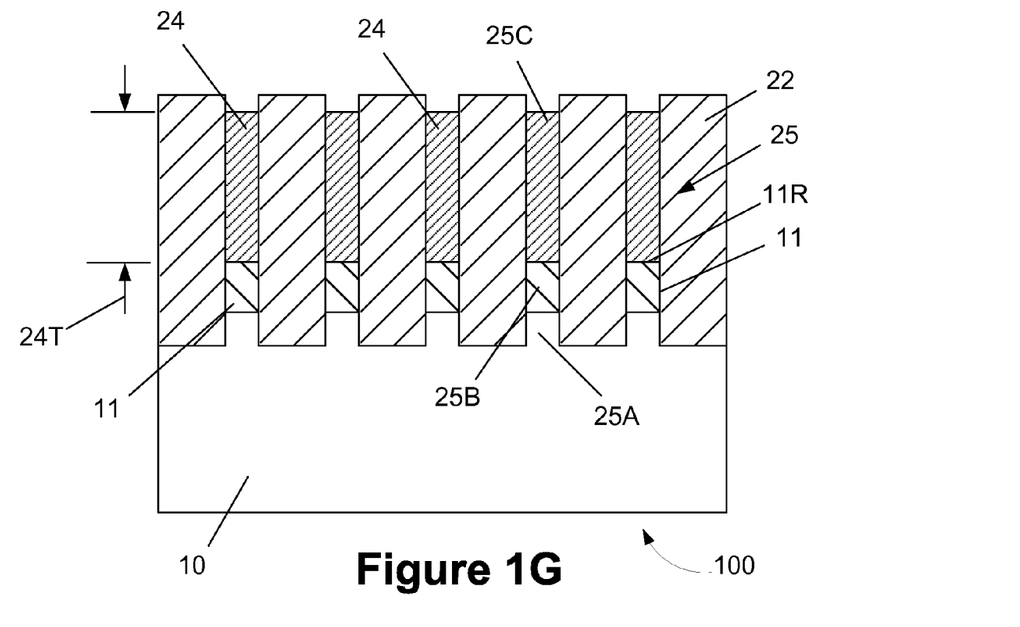

Next, as shown in FIG. 1G, another epitaxial deposition process is performed to form another semiconductor material 24 on the recessed surface 11R of the layer of semiconductor material 11. Collectively, the substrate 10, the layer of semiconductor material 11 and the semiconductor material 24 define the final overall fin structure 25 for the device. The semiconductor material 24 may be comprised of a variety of different materials, e.g., silicon/germanium, silicon/carbon, III-V materials, II-VI materials, etc., or combinations thereof, and it may be either doped (in situ) or undoped. The thickness 24T of the semiconductor material 24 may also vary depending upon the particular application, e.g., 4-80 nm. In one illustrative embodiment, the semiconductor material 24 may be a fully strained layer of silicon/germanium or germanium, and the thickness 24T may be about 65 nm. In one example, the germanium concentration, doping concentration and/or film stress in the semiconductor material 24 may be different than that of the semiconductor material 11, although that may not be the case in all applications. The presence of the semiconductor material 11 improves the quality of the semiconductor material 24 as compared to the quality of the semiconductor material 24 if it were formed on the silicon substrate 10, e.g., the epitaxial quality, the ability to control the introduction of strain into the semiconductor material 24 and/or the capability of forming highly controlled doping profiles in the semiconductor material 24 is improved using the methods disclosed herein.

The substrate 10, the semiconductor material 11 and the semiconductor material 24 serve as the lower first portion 25A, intermediate second portion 25B and upper third portion 25C portion of the final fin structure 25 for the device 100. Of course, the individual height of each of these three portions 25A-C may vary and they may be different from one another.

Figure 1H:
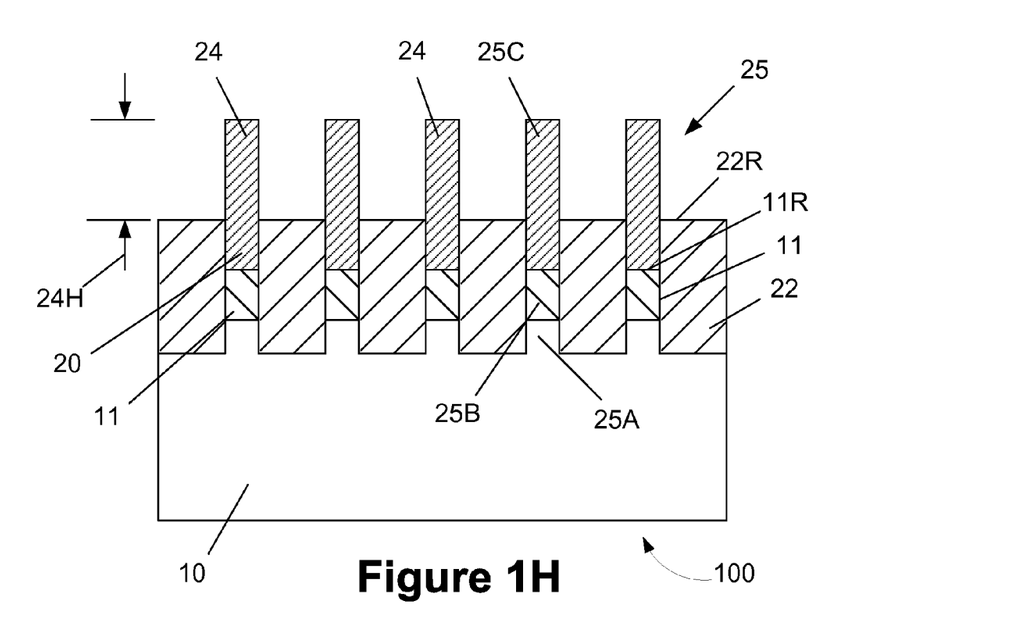

FIG. 1H depicts the device 100 after an etching process has been performed on the layer of insulating material 22 to reduce its thickness and thereby result in the layer of insulating material having a recessed surface 22R. The recessed surface 22R of the layer of insulating material 22 essentially defines the final active fin height 24H of the fins 20. The active fin height 24H may vary depending upon the particular application and, in one illustrative embodiment, may range from about 5-50 nm. In one illustrative example, the recessed surface 22R of the layer of insulating material 22 is positioned above the recessed surface 11R of the layer of semiconductor material 11, i.e., the recessing of the layer of insulating material 22 is controlled such that only the alternative fin material 24 is exposed above the recessed surface 22R of the layer of insulating material 22. In other applications, the layer of insulating material 22 may be recessed by an amount such that the entirety of the alternative fin material 24 and a portion of the semiconductor material 11 is positioned above the recessed surface 22R of the layer of insulating material 22. The substrate 10, the semiconductor material 11 and the semiconductor material 24 serve as the lower 25A, intermediate 25B and upper 25C portions of the final fin structure 25 for the device 100.

Figure 1I:
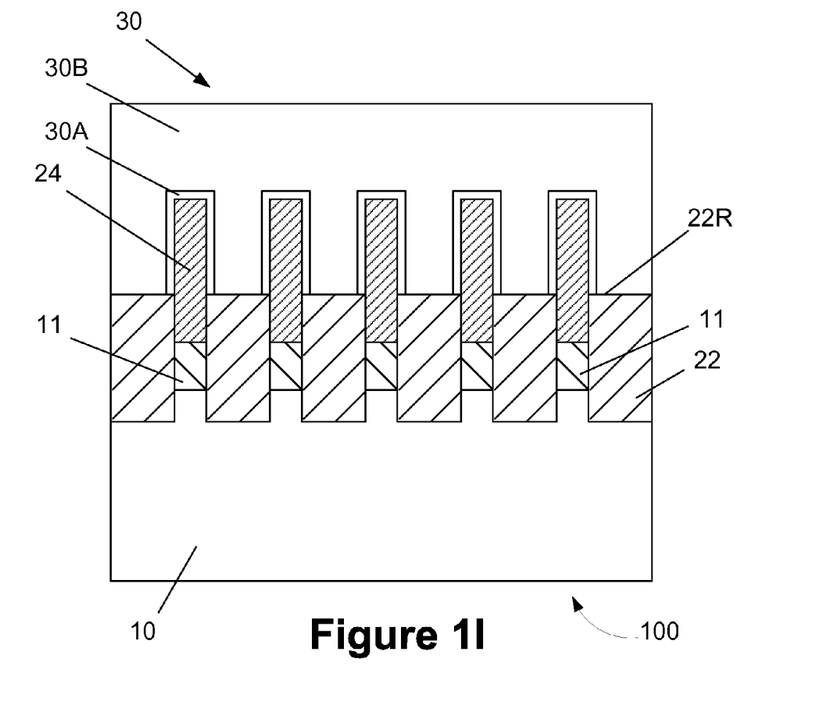

At the point of processing depicted in FIG. 1H, the illustrative FinFET device 100 may be completed using traditional fabrication techniques. For example, FIG. 1I depicts the device 100 after an illustrative gate structure 30 has been formed for the device 100. In one illustrative embodiment, the schematically depicted gate structure 30 includes an illustrative gate insulation layer 30A and an illustrative gate electrode 30B. The gate insulation layer 30A may be comprised of a variety of different materials, such as, for example, silicon dioxide, a so-called high-k (k greater than 10) insulation material (where k is the relative dielectric constant), etc. Similarly, the gate electrode 30B may also be of a material such as polysilicon or amorphous silicon, or it may be comprised of one or more metal layers that act as the gate electrode 30B. As will be recognized by those skilled in the art after a complete reading of the present application, the gate structure of the device 100 depicted in the drawings, i.e., the gate insulation layer 30A and the gate electrode 30B, is intended to be representative in nature. That is, the gate structure 30 may be comprised of a variety of different materials and it may have a variety of configurations, and the gate structure 30 may be made using either the so-called "gate-first" or "replacement gate" techniques. In one illustrative embodiment, as shown in FIG. 1H, an oxidation process or a conformal deposition process may be performed to form a gate insulation layer 30A comprised of a material such as, for example, silicon dioxide, silicon nitride, hafnium oxide, a high-k (k value greater than 10) insulating material, etc., on the fins 20. Thereafter, the gate electrode material 30B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure 30 by blanket-depositing a layer of spacer material and thereafter performing an anisotropic etching process to define the spacers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
    providing a substrate comprised of a first semiconductor material;
    performing a first epitaxial deposition process to form a layer of a second semiconductor material above said substrate;
    forming a patterned hard mask layer above said layer of second semiconductor material;
    performing a first etching process through said patterned hard mask layer to define a plurality of spaced-apart trenches that define first and second portions of a fin for said FinFET device, said first portion being comprised of said first semiconductor material, said second portion being comprised of said second semiconductor material;
    forming a layer of insulating material in said trenches, said layer of insulating material overfilling said trenches and said patterned hard mask layer;
    performing a planarization process on said layer of insulating material that exposes said patterned hard mask layer positioned above said second portion of said fin;
    performing at least one second etching process to remove said patterned hard mask layer positioned above said second portion of said fin to thereby expose an upper surface of said second portion of said fin;
    performing at least one third etching process to reduce a thickness of said second portion of said fin and thereby define a cavity within said layer of insulating material above said second portion of said fin;
    performing a second epitaxial deposition process to form a third portion of said fin on said second portion of said fin within said cavity, said third portion of said fin being comprised of a third semiconductor material that is different than said second semiconductor material; and
    performing a fourth etching process on said layer of insulating material such that a post-etch upper surface of said layer of insulating material after performing said fourth etching process is performed is below an upper surface of said third portion of said fin.

2. The method of claim 1, wherein said first semiconductor material is comprised of silicon, said second semiconductor material is comprised of one of silicon, silicon/germanium, germanium, a III-V material, a II-VI material, or a combination thereof, and said third semiconductor material is comprised of one of silicon, silicon/germanium, germanium, a III-V material, a II-VI material, or a combination thereof.

3. The method of claim 1, wherein said first semiconductor material is comprised of silicon, and said second semiconductor material is comprised of silicon/germanium with a germanium concentration of 1-99%, and said third semiconductor material is comprised of one of silicon, silicon/germanium, germanium, a III-V material, a II-VI material, or a combination thereof.

4. The method of claim 1, wherein said portion of said third portion of said fin that is positioned above said post-etch upper surface of said layer of insulating material defines a final fin height of said FinFET device.

5. The method of claim 1, wherein said post-etch, upper surface of said layer of insulating material is positioned above an upper surface of said second portion of said fin.

6. The method of claim 1, wherein said post-etch, upper surface of said layer of insulating material is positioned below an upper surface of said second portion of said fin.

7. The method of claim 1, wherein performing said planarization process comprises performing a chemical mechanical polishing process.

8. The method of claim 1, wherein said patterned hard mask layer is comprised of a layer of silicon dioxide and a layer of silicon nitride formed on said layer of silicon dioxide.

9. The method of claim 1, wherein said first, second and third semiconductor materials are all different semiconductor materials.

10. A method of forming a FinFET device, comprising:
    providing a substrate comprised of a first semiconductor material;
    performing a first epitaxial deposition process to form a layer of a second semiconductor material above said substrate, said second semiconductor material being different than said first semiconductor material;
    forming a patterned hard mask layer above said layer of said second semiconductor material;
    performing a first etching process through said patterned hard mask layer to define a plurality of spaced-apart trenches that define first and second portions of a fin for said FinFET device, said first portion being comprised of said first semiconductor material, said second portion being comprised of said second semiconductor material;
    forming a layer of insulating material in said trenches, said layer of insulating material overfilling said trenches and said patterned hard mask layer;

performing a planarization process on said layer of insulating material that exposes said patterned hard mask layer positioned above said second portion of said fin;

performing at least one second etching process to remove said patterned hard mask layer positioned above said second portion of said fin to thereby expose an upper surface of said second portion of said fin;

performing at least one third etching process to reduce a thickness of said second portion of said fin and thereby define a cavity within said layer of insulating material above said second portion of said fin;

performing a second epitaxial deposition process to form a third portion of said fin on said second portion of said fin within said cavity, said third portion of said fin being comprised of a third semiconductor material that is different than both of said first and second semiconductor materials; and performing a fourth etching process on said layer of insulating material such that a post-etch upper surface of said layer of insulating material after performing said fourth etching process is performed is below an upper surface of said third portion of said fin.

11. The method of claim 10, wherein said first semiconductor material is comprised of silicon, said second semiconductor material is comprised of one of silicon, silicon/germanium, germanium, a III-V material, a II-VI material, or a combination thereof, and said third semiconductor material is comprised of one of silicon, silicon/germanium, germanium, a III-V material, a II-VI material, or a combination thereof.

12. The method of claim 10, wherein said first semiconductor material is comprised of silicon, and said second semiconductor material is comprised of silicon/germanium with a germanium concentration of 1-99% and said third semiconductor material is comprised of one of silicon, silicon/germanium, germanium, a III-V material, a II-VI material, or a combination thereof.

13. The method of claim 10, wherein said portion of said third portion of said fin that is positioned above said post-etch upper surface of said layer of insulating material defines a final fin height of said FinFET device.

14. The method of claim 10, wherein said post-etch, upper surface of said layer of insulating material is positioned above an upper surface of said second portion of said fin.

15. The method of claim 10, wherein said post-etch, upper surface of said layer of insulating material is positioned below an upper surface of said second portion of said fin.

16. The method of claim 10, wherein performing said planarization process comprises performing a chemical mechanical polishing process.

* * * * *

UNITED STATES PATENT AND TRADEMARK OFFICE
CERTIFICATE OF CORRECTION

PATENT NO. : 8,673,718 B2
APPLICATION NO. : 13/544259
DATED : March 18, 2014
INVENTOR(S) : Maszara et al.

It is certified that error appears in the above-identified patent and that said Letters Patent is hereby corrected as shown below:

In the Claims

Claim 1, column 8, line 15, after "etching process", delete "is performed".

Claim 4, column 8, line 31, after "wherein", delete "said portion of".

Claim 10, column 9, line 21, after "etching process", delete "is performed".

Claim 13, column 10, line 12, after "wherein", delete "said portion of".

Signed and Sealed this
Tenth Day of June, 2014

Michelle K. Lee
*Deputy Director of the United States Patent and Trademark Office*